(12) United States Patent
Chung et al.

(10) Patent No.: US 6,348,363 B1
(45) Date of Patent: Feb. 19, 2002

(54) METHOD FOR MANUFACTURING A SEMICONDUCTOR PACKAGE

(75) Inventors: Myung Kee Chung; Hee Kook Choi; San Yeop Lee, all of Cheonan (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/483,252

(22) Filed: Jan. 14, 2000

(30) Foreign Application Priority Data

Jul. 6, 1999 (KR) .............................. 99-27041

(51) Int. Cl.[7] .................. H01L 21/44; H01L 21/48; H01L 21/58; H01L 21/30; H01L 21/46
(52) U.S. Cl. .................. 438/106; 438/113; 438/114; 438/462; 438/977; 438/459
(58) Field of Search ................... 438/106, 113, 438/114, 462, 977, 459

(56) References Cited

U.S. PATENT DOCUMENTS

| | | | |
|---|---|---|---|
| 3,838,501 A | * | 10/1974 | Umbaugh |
| 3,978,578 A | * | 9/1976 | Murphy |
| 5,948,233 A | * | 9/1999 | DeSamber et al. |
| 6,033,937 A | * | 3/2000 | Manteghi |
| 6,046,075 A | * | 4/2000 | Manteghi |
| 6,075,280 A | * | 7/2000 | Yung et al. |
| 6,118,184 A | * | 9/2000 | Ishio et al. |

* cited by examiner

Primary Examiner—John F. Niebling
Assistant Examiner—Josetta I. Jones
(74) Attorney, Agent, or Firm—Skjerven Morrill MacPherson LLP

(57) ABSTRACT

A semiconductor package and a manufacturing method prevent electrical shorts that otherwise result from bonding wires contacting the edge of a semiconductor chip. An insulating region at the edge of a semiconductor chip prevents the shorts. One method for forming the insulating region leaves a polyimide layer on the scribe area of a wafer and cuts through the polyimide layer. To avoid chipping, the cutting uses a fine grit blade and a slow cutting rate. An alternative process removes the polyimide from the scribe area and forms the insulating region on the edge of the semiconductor chip. A potting method can deposit the insulating region on a semiconductor chip after cutting a wafer and after attaching a separated chip to a substrate. Alternatively, plotting or printing can apply insulating material on the wafer. A cutting process then cuts through the insulating material and the wafer and leaves insulating regions on each separated chip. A groove can be formed in the scribe area and then filled with insulating material before cutting along the groove. As a result, the insulating material from inside the groove extends onto the sides of the separated semiconductor chips. If the groove is formed before backside grinding of the wafer, the insulating region can cover the side of a chip. The insulating material is typically an epoxy type resin that can be cut without chipping.

19 Claims, 11 Drawing Sheets

METHOD FOR MANUFACTURING A SEMICONDUCTOR PACKAGE

BACKGROUND OF THE INVENTION

1. Field of the Invention

The present invention relates to integrated circuit packages and manufacture of intergrated circuit packages and more particularly to preventing electrical shorts that result from bonding wires contacting the edge of a semiconductor chip.

2. Description of the Related Art

A typical goal in manufacture of electronic appliances is to make the electronic appliances small and thin. To meet this goal, the integrated circuits in thr electronic appliances also need to be small and thin. Accordingly, high-density integration, which provides smaller semiconductor chips, and efficient packaging, which provides smaller IC packages, have become very important for the devices in electronic appliances. In the computer filed, semiconductor chips need to be relatively large to accommodate the required capabilities and the large numbers of circuit elements in devices, such as RAMs (Random Access Memories) and Flash memories. Accordingly, smaller packages for the chips have been studied.

One way to reduce chip size is to form a center pad type semiconductor chip. Generally, a center pad type semiconductor chip is smaller than an edge pad type semiconductor chip that contains the same circuitry. Accordingly, many integrated circuit manufacturers make semiconductor chips of the center pad type to obtain more chips per wafer.

One of the packages recently developed is the ball grid array (BGA) package. The BGA package has advantages of requiring a small mounting area on a motherboard and providing superior electrical characteristics when compared to a plastic package. In a BGA package, a printed circuit board is used instead of the lead frame common to plastic packages. A semiconductor chip attaches to one surface of the circuit board. On the opposite surface of the circuit board are solder balls that act as external terminals for direct attachment to a motherboard. The BGA package has the advantage of a high mounting density on the motherboard. However, bonding wires in a package containing a center pad type semiconductor chip extend across part of the semiconductor chip and then down to a lead frame or printed circuit board on which the semiconductor chip is mounted. These bonding wires can sag or otherwise contact the edge of an active surface of the semiconductor chip and create electrical shorts.

FIG. 1 shows a cross-sectional view of a known BGA package 100. FIG. 2 shows a cross-sectional view of a wafer being separated into semiconductor chips 10, one of which is in the BGA package of FIG. 1. As shown in FIGS. 1 and 2, the BGA package 100 includes the semiconductor chip 10 that is mounted on an upper surface of a substrate 20. Bonding wires 50 electrically connect a pad 12 on the semiconductor chip 10 to the substrate 20. A molding resin encapsulates an upper surface of the substrate 20 including the semiconductor chip 10 and the bonding wire 50, thereby forming a resin encapsulation portion 30. Solder balls 40 on a lower surface of the substrate 20 connect to the semiconductor chip 10 via conductive patterns 24 and conductive vias 26.

The substrate 20 is a printed circuit board including a substrate body 22. The conductive patterns 24 include a top wiring pattern 23 on the upper surface of the substrate body 22 and and a bottom wiring pattern 25 formed on the lower surface of the substrate body 22. The bonding wires 50 electrically connect the bonding pads 12 to the top wiring pattern 23. Conductive vias 26 electrically connect to the top wiring pattern 23 to the bottom wiring pattern 25 on which the solder balls 40 reside.

The semiconductor chip 10 is of the center pad type and has the bonding pads 12 in a central portion of an active area. The semiconductor chip 10 also includes a silicon substrate 90, a nitride layer 14, and a polyimide layer 16. Integrated circuit elements reside in and on silicon substrate 90, and nitride layer 14 as a non-active passivation layer protects the integrated circuits and pads 12. Polyimide layer 16 helps resist collection of an electrostatic charge on the nitride layer 14 and damage from alpha rays.

As shown in FIG. 2, scribe areas 82 separate the semiconductor chips formed in a wafer 80. A diamond cutter 60 cuts wafer 80 along the scribe area 82 and separates individual semiconductor chips 10. To facilitate cutting of the wafer 80, polyimide layers are absent from the scribe areas 82. Otherwise, the polyimide can stick to cutter 60 and cause chipping of the wafer 80.

Returning to FIG. 1, the length of a bonding wire 50 that connects a pad 12 and the top wiring pattern 23 of the substrate 20 is longer than that of a bonding wire in packaging for a semiconductor chip of the edge pad type. Further, the bonding wire 50 is typically at a low height above the chip 10 to reduce the thickness of the semiconductor package 100. Accordingly, the bonding wire 50 may contact the edge 18 of the active area of the semiconductor chip 10.

As noted above, the polyimide layer 16 is missing from the edge of the active area of the semiconductor chip 10, and a nitride layer 14 is exposed. When the bonding wire sags or otherwise contacts the edge 18 of semiconductor chip 10, the nitride layer 14 may insulate the bonding wire 50 from underlying integrated circuits, but electrical shorts can result because the nitride layer is thin and may be chipped. The electrical shorts are often a consequence of the mechanical cutting of a wafer. A cutting process preferably cuts the nitride layer 14 to form a very smooth surface, and chipping during the cutting process can expose the edge of an active surface in the silicon substrate 90 below the nitride layer 14 and allow shorts with the bonding wire 50.

Increasing the height of the bonding wire to avoid contact with the edge of the semiconductor chip avoids electrical shorts, but increasing the height of the bonding wire also increases the thickness of the semiconductor package. Additionally, larger semiconductor chips have longer distance from the pads to the edge in the semiconductor chip, and the thickness of the packages must increase in proportion to the size of the chip. Otherwise the probability of the bonding wire contacting the edge of the semiconductor chip increases, and the problem of electrical shorts arises.

SUMMARY OF THE INVENTION

In accordance with an aspect of the present invention, a semiconductor package has an insulating region at the edge of the active area of the semiconductor chip to avoid electrical shorts when bonding wires contact the edge of the active area of the semiconductor chip.

In one embodiment of the invention, a semiconductor package includes a semiconductor chip, a substrate, and a resin encapsulation portion. The semiconductor chip includes a silicon substrate having an active area containing integrated circuits and a plurality of pads. The pads electrically connect to the integrated circuits and are along a center portion of the active area. A non-active layer overlies the active area except for the pads, and a polyimide layer is on the non-active layer. The polyimide layer helps prevent damage resulting from electrical shorts or alpha rays. A surface of the semiconductor chip, which is the opposite the active area of the semiconductor chip, attaches to an upper surface of the substrate. One or more bonding wires electrically connect the pads of the semiconductor chip to the substrate. The resin encapsulation portion encapsulates the semiconductor chip and bonding wires on the upper surface of the substrate. External terminals are on the lower surface of the substrate and electrically connected to the semiconductor chip. At the edge of the substrate, the boding wire contacts with the polyimide layer, thereby preventing electrical shorts between the bonding wire and the silicon substrate.

In another embodiment of the present invention, a semiconductor package includes a semiconductor chip, a substrate, bond wires, and a resin encapsulation portion. The semiconductor chip includes a silicon substrate having an active area containing integrated circuits, a plurality of pads electrically connected to the integrated circuits, a non-active layer on the active area except for the pads, a polyimide layer formed on the non-active layer, and an insulation layer along the edge of the silicon substrate. The pads are along a center portion of the active area. The surface of the semiconductor chip that is opposite the active area attaches to the upper surface of the substrate. The bonding wires electrically connect the pads of the semiconductor chip to the substrate. The resin encapsulation portion encapsulates the semiconductor chip and bonding wires at the upper surface of the substrate. External terminals are on the lower surface of the substrate and electrically connected to the semiconductor chip. At the edge of the silicon substrate, a bonding wire contacts the insulation layer, thereby preventing electrical shorts between the bonding wire and the silicon substrate. Preferably, the insulation layer is on the edge of the active surface of the semiconductor chip and may extend over a neighboring portion of the side surface of the semiconductor chip. A plastic resin of an epoxy type can be used in the insulation layer.

Another embodiment of the present invention is a method for manufacturing a semiconductor package. The manufacturing method uses a semiconductor wafer having a plurality of semiconductor chips and a scribe area between the semiconductor chips. Each semiconductor chip includes integrated circuits on an active area of the semiconductor wafer, a plurality of pads electrically connected to the integrated circuits, a non-active layer on the active area except for the pads, and a polyimide layer formed on the non-active layer to prevent damage from electrical shorts or alpha rays. The manufacturing method includes removing the polyimide layer from the pads; cutting the wafer along the scribe area to separate the individual semiconductor chips; attaching one or more of the semiconductor chips to a substrate; attaching bonding wires that electrically connect the pads of the semiconductor chip to the substrate; and encapsulating the semiconductor chip and the bonding wires. The bonding wire contacts the polyimide layer at the edge of the semiconductor chip, thereby preventing electrical shorts between the bonding wire and the silicon substrate.

In the above method, the wafer cutting uses a diamond cutter with a grit size of 2 through 4 µm or 0.3 through 3 µm, and the wafer is cut along the scribe area at a cutting rate of 20 mm of depth per second and a rotational speed between 35,000 and 40,000 rpm.

In an another embodiment of the present invention, a method for manufacturing a semiconductor package again starts with a semiconductor wafer including a plurality of semiconductor chips and a scribe area between the semiconductor chips. Each semiconductor chip includes integrated circuits on an active area of the wafer, a plurality of pads electrically connected to the integrated circuits, a non-active layer formed on the active area except for the pads, and a polyimide layer formed on the non-active layer. The method includes removing the polyimide layer from the pad and the scribe area; forming an insulation layer on the scribe area; cutting the wafer along the scribe area to separate individual semiconductor chips; attaching a semiconductor chip on an upper surface of a substrate; attaching bonding wires that electrically connect the pads of the semiconductor chip to the substrate; and encapsulating the semiconductor chip and the bonding wire. At the edge of the substrate, the bonding wire contacts the insulation layer, thereby preventing electrical shorts between the bonding wire and the silicon substrate. In this embodiment, after removing portions of the polyimide layer, the method may further include forming a groove in the scribe area. The groove is wider than the width of lines cut in the wafer to separate the wafer into individual semiconductor chips. Cutting the wafer and forming the insulation groove can be accomplished using a diamond cutter with a grit size of 4 through 6 µm while cutting along the scribe area at a rate of 80 mm of depth per second and a speed of rotation between 35,000 and 40,000 rpm. Formation of the groove is before backside grinding of the wafer. After forming the insulation layer in the groove, the backside grinding of the wafer exposes the insulation material filled into the groove. The insulation layer is typically a plastic resin of an epoxy type and can be formed by potting or printing methods.

Other advantages and features of the present invention will become more apparent and the invention itself will best be better understood by referring to the following description taken in conjunction with the accompanying drawings.

BRIEF DESCRIPTION OF THE DRAWINGS

FIG. 6b is a cross-sectional view along the line of 6b—6b of FIG. 6a.

DETAILED DESCRIPTION OF THE PREFERRED EMBODIMENTS

Figure 1:
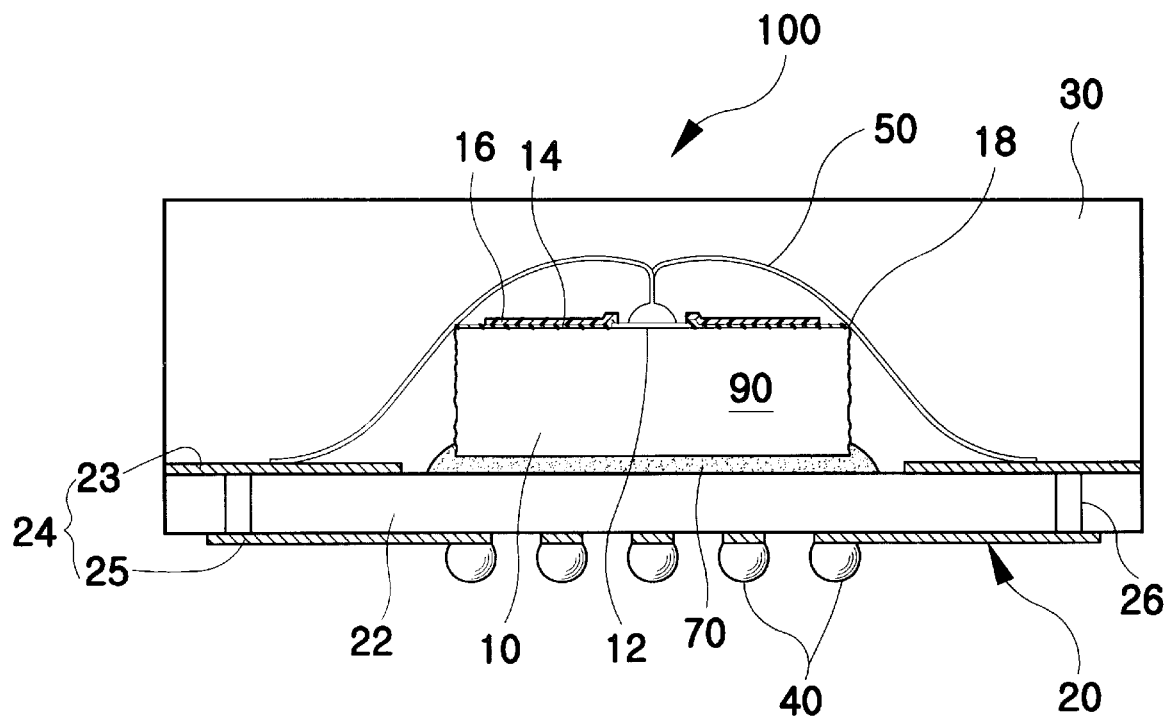
FIG. 1 is a cross-sectional view of a conventional ball grid array package.
Figure 2:
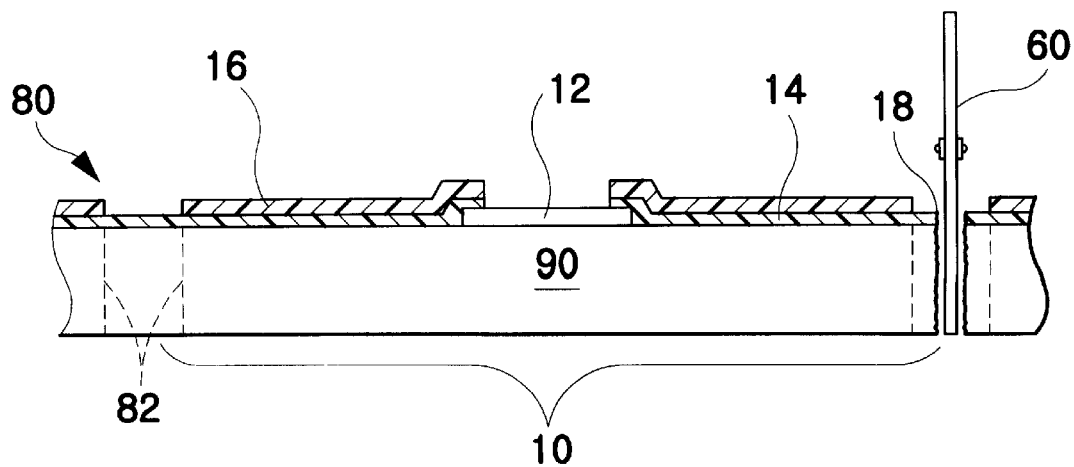
FIG. 2 is a cross-sectional view illustrating separation of the semiconductor chips form in a wafer.
Figure 3:
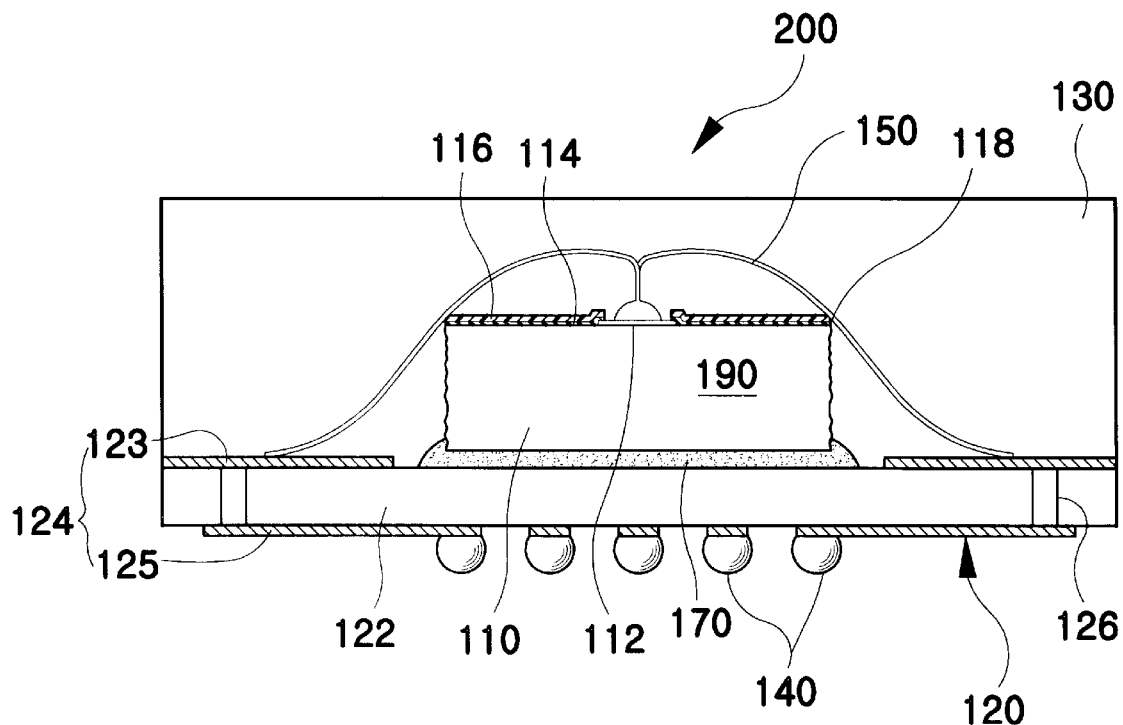
FIG. 3 is a cross-sectional view of a ball grid array package according to an embodiment of the present invention.

FIG. 3 is a cross-sectional view showing a BGA package 200 according to an embodiment of the present invention. BGA package 200 includes a semiconductor chip 110 mounted by a non-conductive adhesive 170 at the center of the upper surface of a substrate 122. The substrate 122 is an insulating board having circuit wiring 124 in and on the substrate 122. Circuit wiring 124 includes a top wiring pattern 123 on the upper surface of the substrate 122 and a bottom wiring pattern 125 on the lower surface of the substrate 122. Via holes 126 penetrate from the upper surface to the lower surface, and conductors (not shown) in the via holes 126 connect the top and bottom wiring patterns 123 and 125. The semiconductor chip 110 includes a plurality of bonding pads 112 on an active area of the upper surface thereof. A nitride layer 114, as a non-active layer, is also on the upper surface except for the pads 112. The nitride layer 114 is a passivation layer that protects the integrated circuits formed in the semiconductor chip 110 from the external environment. A polyimide layer 116 on the nitride layer 114 helps prevent electrical shorts and damage of semiconductor chip 110 by alpha rays. Bonding wires 150 electrically connect the bonding pads 112 and the top wiring pattern 123. In package 200, although the bonding wires 150 may contact the upper edge of the semiconductor chip 110, electrical shorts do not occur because the polyimide layer 116 covers the upper edge 118 of the semiconductor chip 110.

Figure 4A:
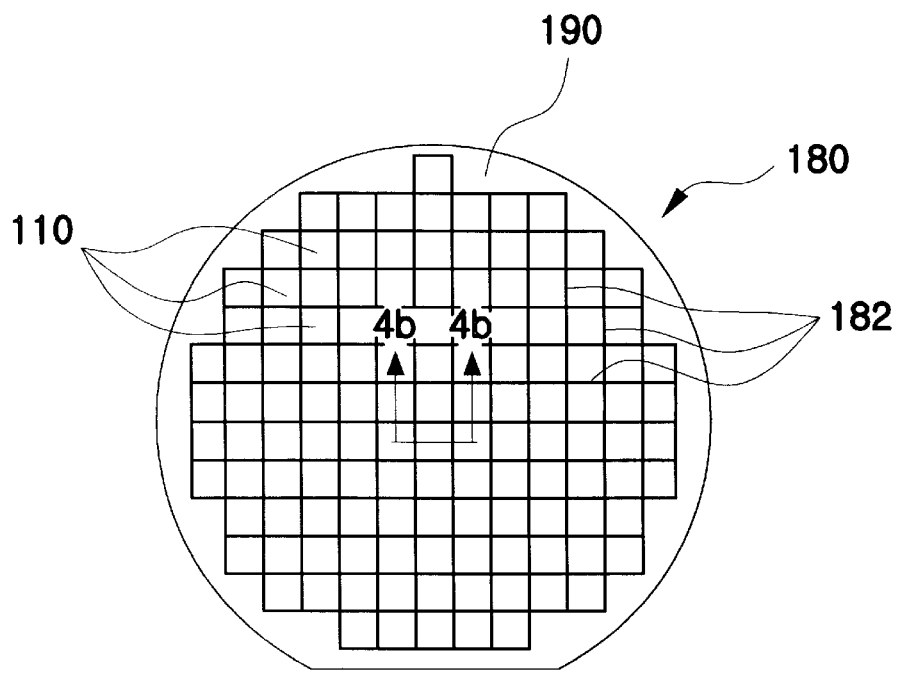
FIG. 4a is a plan view of a wafer.
Figure 4B:
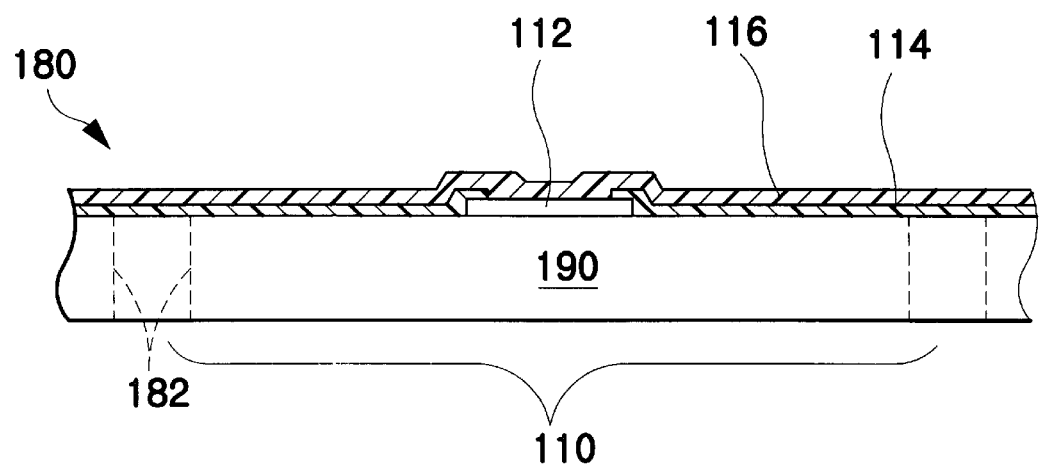
FIG. 4b is a cross-sectional view along the line 4b—4b of FIG. 4a before separation of individual semiconductor chips.
Figure 4C:
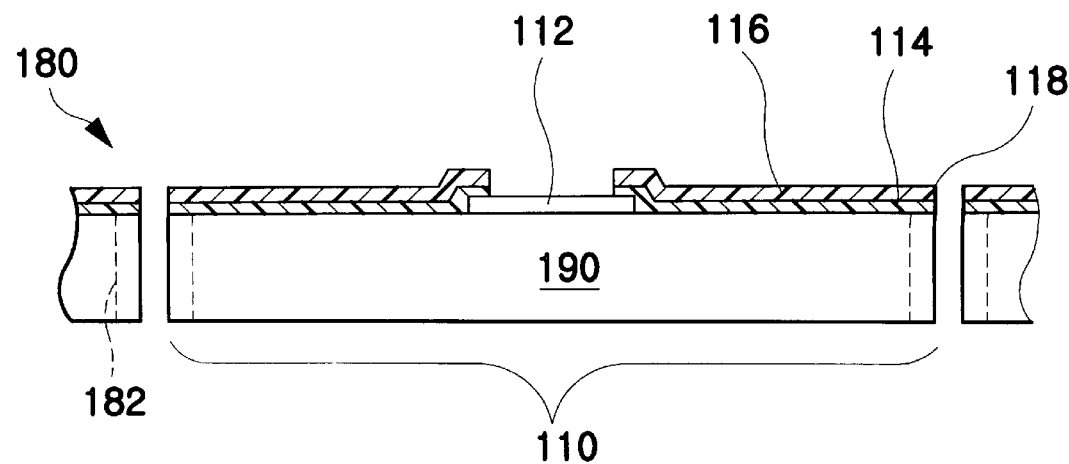
FIG. 4c is a cross-sectional view along the line 4b—4b after cutting a wafer along scribe area of the wafer.

FIGS. 4a, 4b, and 4c illustrate a method for manufacturing the semiconductor chip 110, which is in BGA package 200. FIG. 4a is a plan view of a silicon wafer 180 that includes a plurality of semiconductor chips 110. Conventional wafer manufacturing processes, which are well-known in the art, can form integrated circuits on the semiconductor chips 110. The wafer includes scribe lines in a scribe area 182 that lacks circuitry and is between neighboring semiconductor chips 110. Since the manufacturing method of the circuit devices in the semiconductor chips 110 is not critical to this invention, a detailed description of the integrated circuit manufacturing process is omitted.

As shown in FIG. 4b, a bonding pad 112, which electrically connects to the integrated circuits in a silicon substrate 190, is on an active area of the silicon substrate 190. A nitride layer 114, as a non-active passivation layer, covers the active surface of the silicon substrate 190 and the edges of the bonding pad 112 to protect the integrated circuits. A polyimide layer 116 is on the nitride layer 114 and the bonding pad 112 and protects the integrated circuits from damage that electric shorts or alpha rays might otherwise cause. In an exemplary embodiment, the bonding pad 112 is aluminum and resides in the central portion of the active surface of a semiconductor chip 110.

As shown in FIG. 4c, a process for removing the polyimide layer 116 from the pad 112, i.e., a photolithography process leaves the polyimide in the scribe areas 182. The wafer 180 is cut along the scribe lines in the scribe area 182, thereby separating the wafer 180 into individual semiconductor chips 110. That is, in this embodiment, the cutting process cuts the wafer 180 while the polyimide layer 116 remains on the scribe area 182. Previous manufacturing processes removed the polyimide to avoid the chipping that the polyimide layer causes during the cutting process. The cutting process in accordance with this embodiment of the invention reduces or avoids the chipping through use of a diamond cutter with a smaller grit size and a slower forwarding speed than those conventionally used. In particular, a diamond cutter with grit size of 2 through 4 $\mu$m or 0.3 through 3 $\mu$m and a rotational speed between 35,000 and 40,000 rpm cuts the wafer 180 at the rate of 20 mm of depth per second.

The above embodiment of the invention uses the polyimide layer 116 to prevent electrical shorts between the substrate 190 and the bonding wire 150. Other embodiments of the invention, described below, use a plastic resin of an epoxy type at the edge of the active area of the semiconductor chip to prevent shorting.

Figure 5:
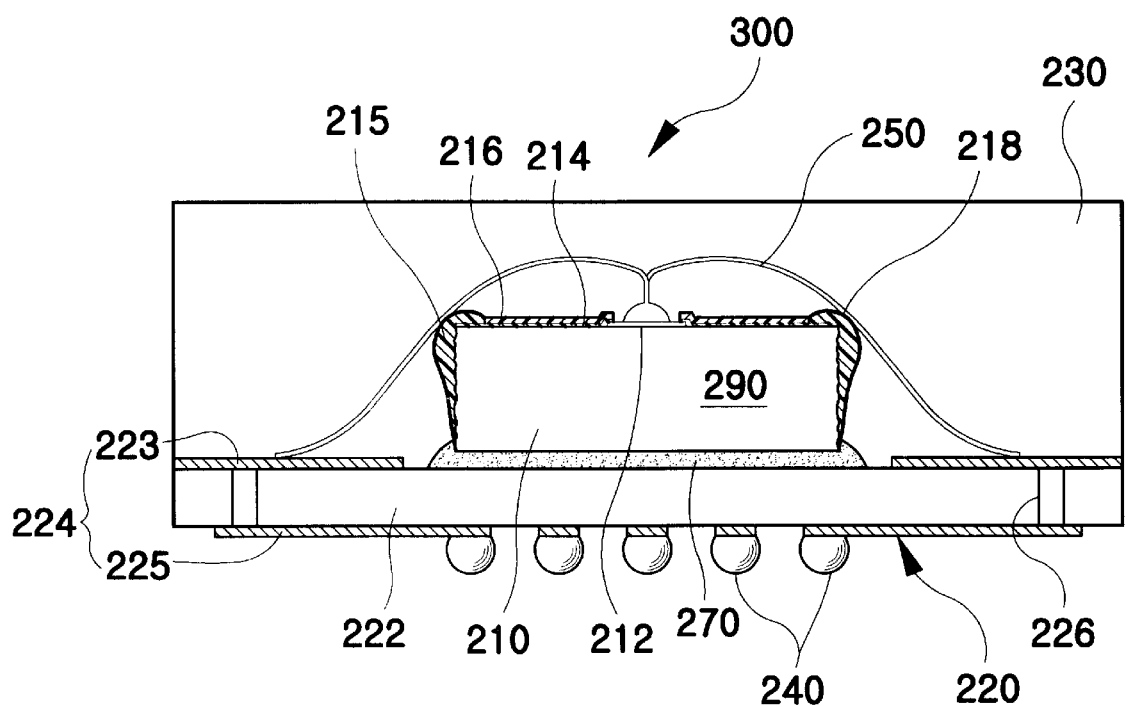
FIG. 5 is a cross-sectional view showing a ball grid array package according to another embodiment of the present invention.

FIG. 5 is a cross-sectional view showing a BGA package 300 according to another embodiment of the present invention. BGA package 300 includes a semiconductor chip 210 attached to an upper surface of a substrate 220 by a non-conductive adhesive 270. Bonding wires 250 electrically connect bonding pads 212 of the semiconductor chip 210 to a top wiring pattern 223 of the substrate 220. A mold resin encapsulates an upper surface of the substrate 220 including the semiconductor chip 210 and the bonding wires 250. A plurality of solder balls 240 is on a bottom wiring pattern 225 of the lower surface of the substrate 220 and electrically connects with the semiconductor chip 210.

In the BGA package 300, an insulation layer 215 resides on the edge 218 of the semiconductor chip 210. That is, the insulation layer resides at the edge of the active area of the semiconductor chip 210 and on the remaining scribe area of the semiconductor chip 210, where the polyimide layer is absent. Further, the insulation layer 215 is not only on the top surface of the semiconductor chip 210 but also on the side surface of the semiconductor chip 210. Accordingly, bonding wires 250 contact the insulation layer 215 at the edge 218 of the semiconductor chip 210, and the insulation layer 215 prevents electrical shorts between substrate 290 and the bonding wire 250. Here, a potting or print method can form the insulation layer 215.

Figure 6A:
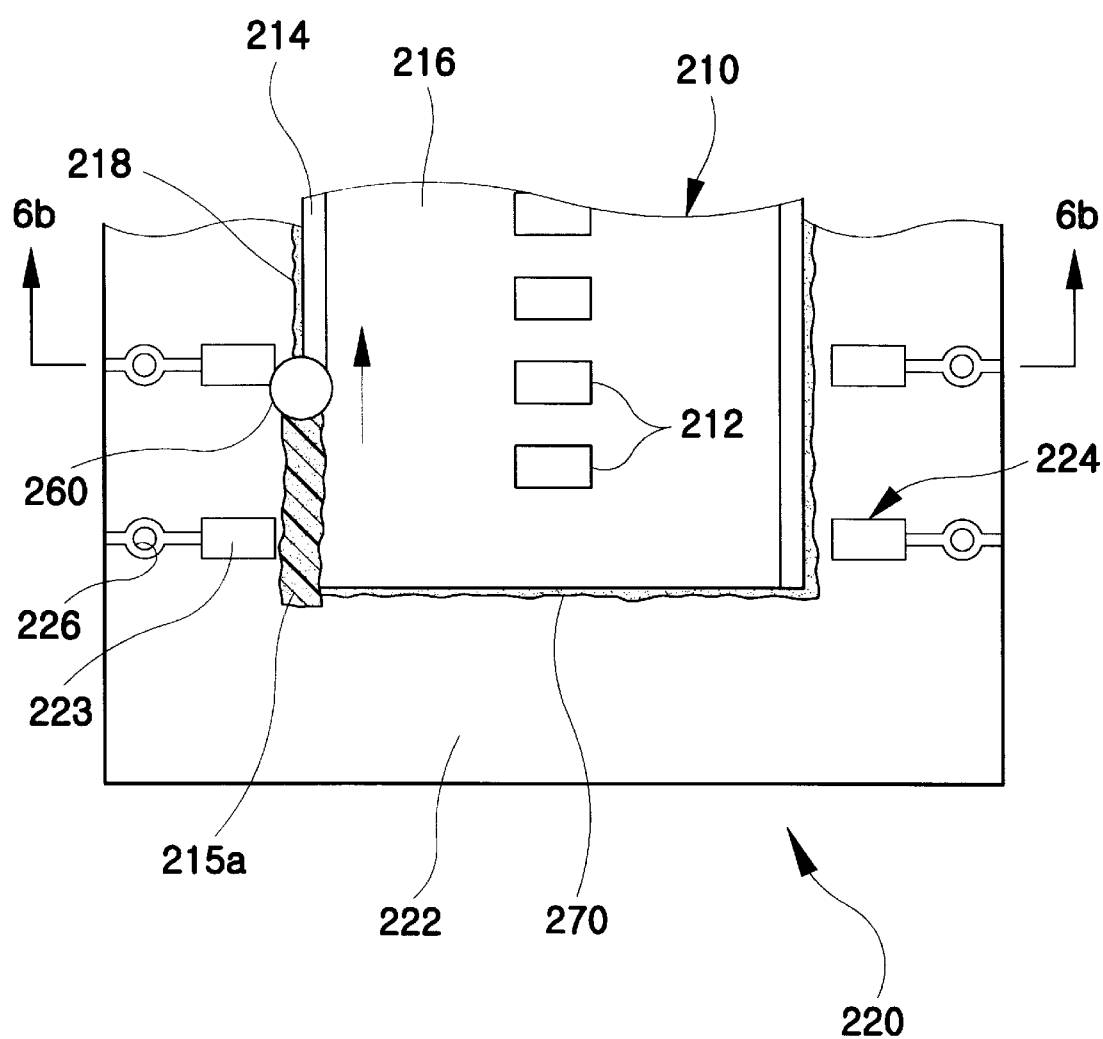
FIG. 6a is a plan view illustrating the formation of insulation along the edge of a semiconductor chip attached to a substrate.
Figure 6B:
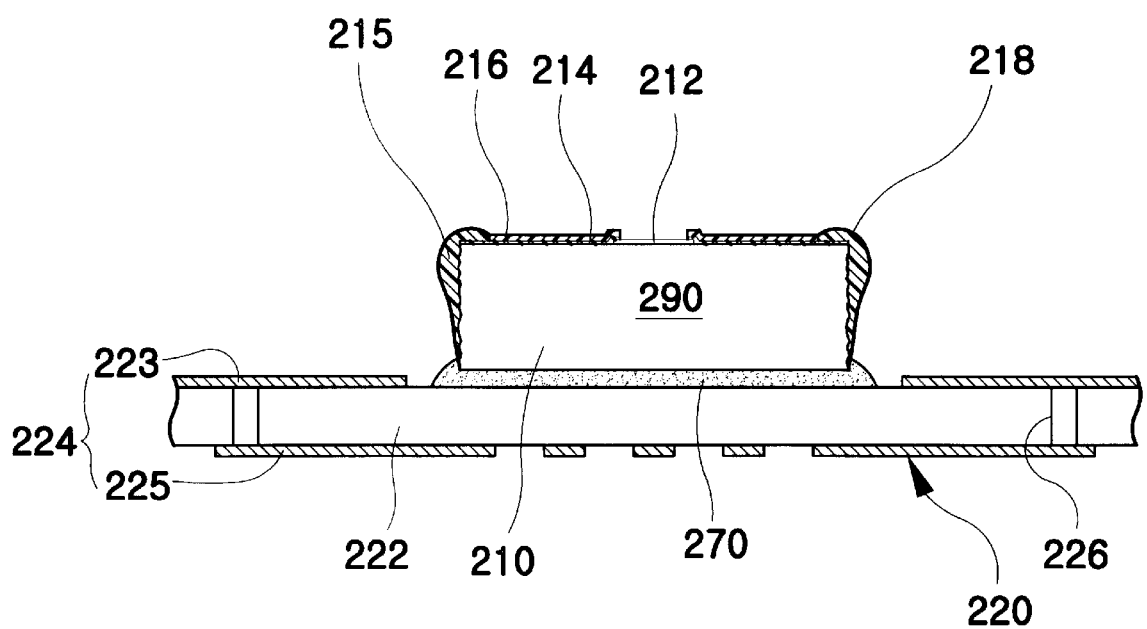

A potting method for forming an insulation layer on the edge of the active surface of the semiconductor chip is explained with reference to FIGS. 6a and 6b. After attaching the semiconductor chip 210 to the top surface of the substrate 220 with a non-conductive adhesive 270, a syringe 260 applies an insulating material 215a to cover the edge 218 of the active area of the semiconductor chip 210. Curing of the insulating material 215a then forms the insulation layer 215 (FIG. 5). A plastic resin of an epoxy type is preferable as the insulating material 215a. A conventional wafer fabrication process fabricates the semiconductor chip 210. In particular, the fabrication process removes the polyimide layer from the edge of the active area, thereby exposing a nitride layer. The insulating material 215a covers on the exposed portion of the nitride layer and extends onto the side of the semiconductor chip 210.

After the potting method forms the insulation layer 215 as described above, conventional package manufacturing processes complete the BGA package 300. In particular, wire bonding attaches bonding wires 250, molding encapsulates the semiconductor chip 210 and the bonding wires 250, and a solder ball forming processes forms the external terminals of BGA package 300. FIG. 5 shows the complete BGA package 300 using the semiconductor chip 210 having the insulation layer 215 formed by the potting method.

Figure 7A:
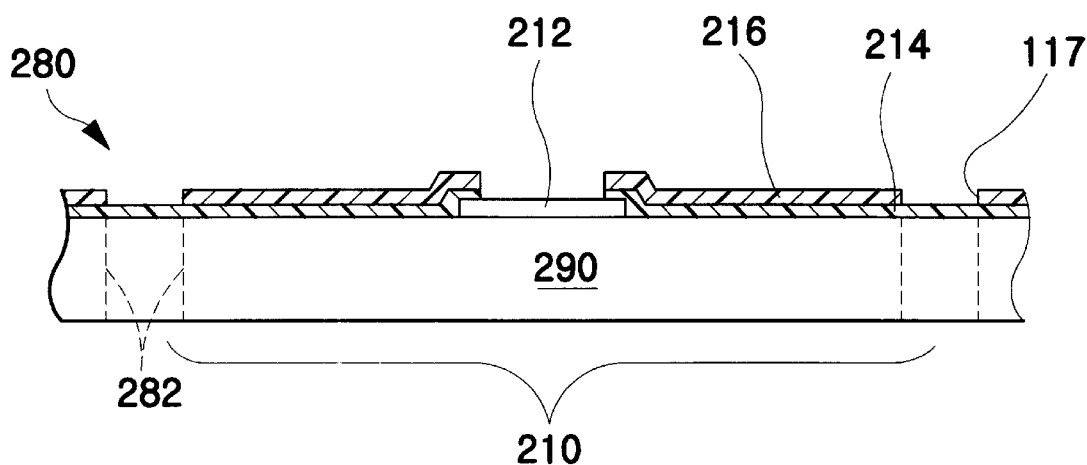
FIG. 7a is a cross-sectional view of a wafer having a polyimide layer exposing scribe lines and pads.

FIGS. 7a through 7e illustrate a printing method for forming an insulation layer on the edge of the active area of the semiconductor chip. As shown in FIG. 7a, a wafer 280 has part of a polyimide layer 216 removed to expose a portion of a nitride layer 214 and the bonding pad 212. The wafer 280 is in a state before backside grinding and has a thickness of about 640 μm for an 8-inch wafer and about 825 μm for a 12 inch wafer.

Figure 7B:
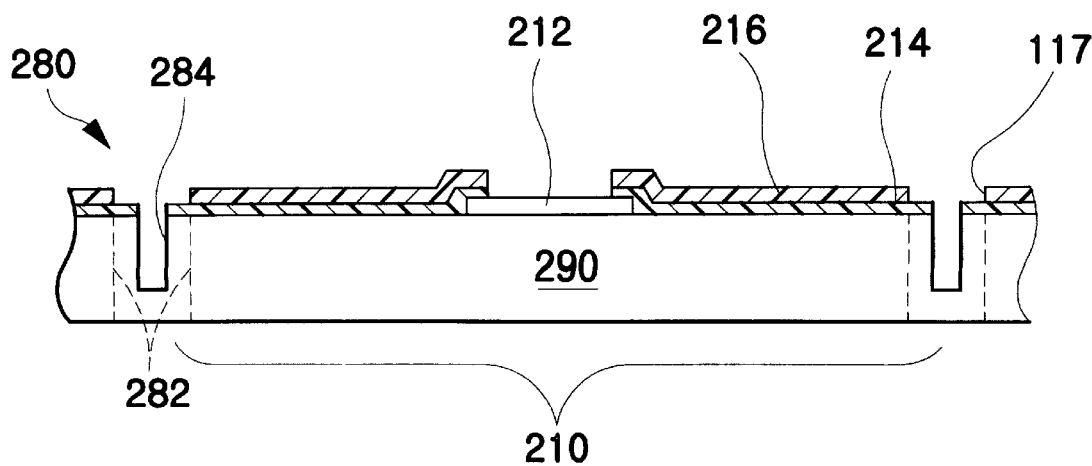
FIG. 7b is a cross-sectional view of a wafer that is cut to form a groove in the scribe area.

FIG. 7b shows the wafer after the formation of a groove 284 in scribe area 282. Cutting the wafer along its scribe lines to a predetermined depth forms the groove 284. The groove 284 is wider than the width that is required for cutting the wafer when separating the wafer into the individual semiconductor chips 210.

Since the semiconductor chip 210 typically has a thickness between about 280 μm and about 450 μm, the groove 284 preferably has a depth between about 320 μm and about 500 μm. Generally, the depth of the groove 284 depends on the desired thickness of the semiconductor chip 210. The width of the insulation groove 284 typically depends on the width of the scribe area 282 and the width required for separating the chips. When the width of the scribe area 282 is about 120 μm and the width of the cut separating the chips is between 45 μm and 50 μm, the width of the groove 284 is about 60 μm.

Figure 7C:
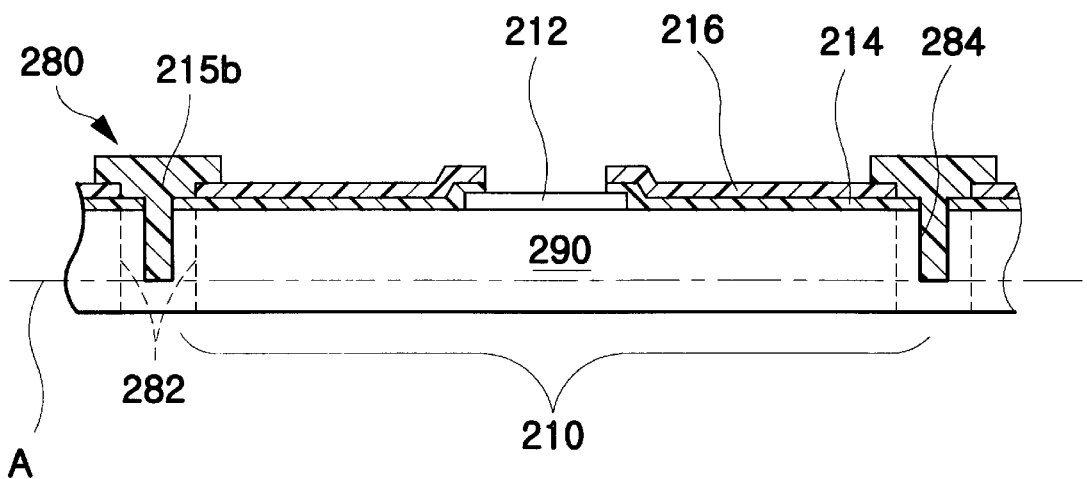
FIG. 7c is a cross-sectional view of the wafer of FIG. 7b after filling the groove with an insulating material.

Next, as shown in FIG. 7c, printing deposits an insulating material 215b on the polyimide layer 216, the nitride layer 214, and in the groove 284. A mask (not shown) having an opening that exposes the insulation groove 284 can define the boundaries of the insulating material 215b. The mask is removed, and the insulation material 215b is cured. Alternatively, instead of the printing method, potting can fill the insulation groove 284 with or without a mask to control the boundaries of the insulating material 215b.

Figure 7D:
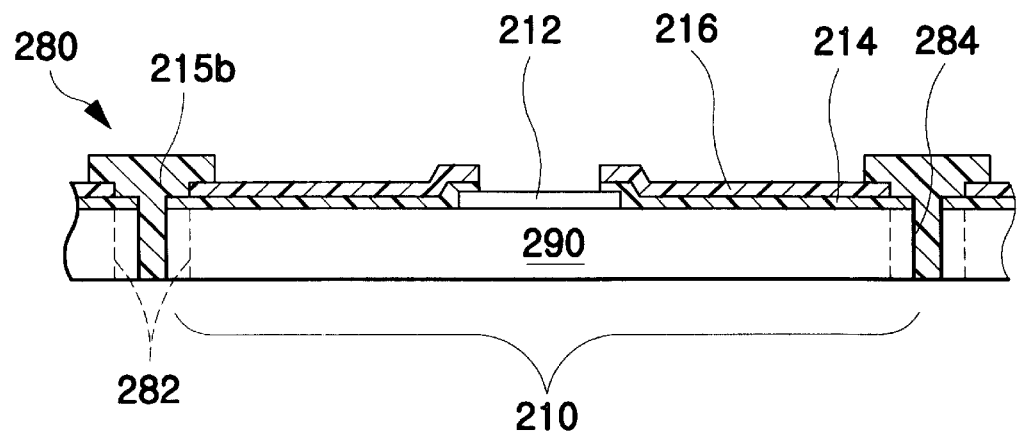
FIG. 7d is a cross-sectional view of the wafer of FIG. 7c after backside grinding.

FIG. 7d shows the wafer after grinding of a backside of the wafer to expose the insulation material 215b at the bottom of the groove 284. In FIG. 7c, a plane 'A' denotes a destination of the backside grinding of the wafer 280. As mentioned above, after grinding the wafer, the thickness of the semiconductor wafer is between about 280 μm and about 450 μm.

Figure 7E:
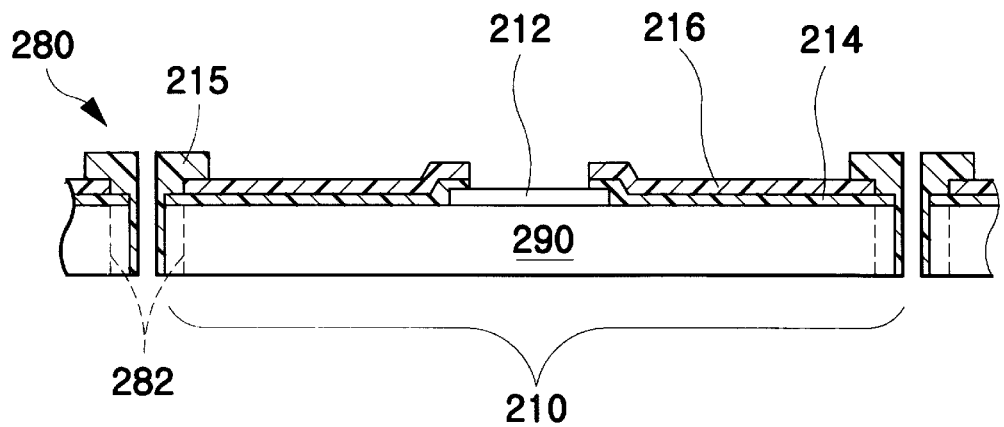
FIG. 7e is a cross-sectional view of the wafer of FIG. 7d after cutting the wafer along scribe lines.

FIG. 7e shows the wafer 280 after cutting in scribe area 282 separates the wafer 280 into individual semiconductor chips 210. Since the width required for cutting the wafer is less than the width of the groove, a part of the insulation material 215b from the groove remains after cutting the wafer. Accordingly, the insulation layer 215 remains on the top and side surfaces of the semiconductor chip. The conditions or parameters for cutting the wafer 280 in FIG. 7b and FIG. 7e are the same as those used in conventional wafer cutting processes. For example, a diamond cutter can have a grit size of 4 μm through 6 μm, and the cutting rate is about 80 mm of depth per second at the speed of rotation between 35,000 and 40,000 rpm.

After obtaining the individual semiconductor chips 210 having the insulation layer 215, conventional processes such as semiconductor chip attaching, wire bonding, molding, and solder ball forming complete the semiconductor package.

Figure 8:
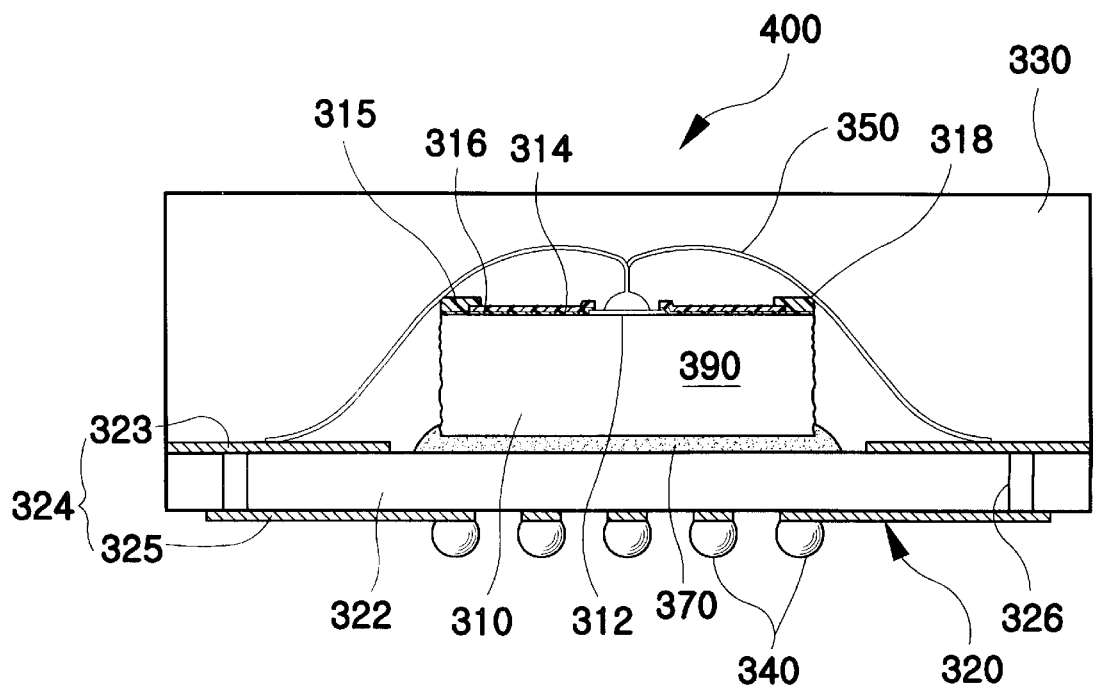
FIG. 8 is a cross-sectional view of a ball grid array package according to yet another embodiment of the present invention.

FIG. 8 is a cross-sectional view showing a BGA package 400 according to yet another embodiment of the invention. The BGA package 400 includes a semiconductor chip 310 having an insulation layer 315 on the edge of its active area. The remaining structure of the BGA package 400 is the same as described above. Here, a potting or printing method forms the insulation layer 315. A bonding wire 350, which connects a pad 312 of the semiconductor chip 310 to a top wiring pattern 323 of a substrate 320, contacts the insulation layer 315 formed on the edge 318 of the semiconductor chip 310. The insulating layer 315 thereby prevents electrical shorts between the bonding wire 350 and the silicon substrate 390.

Figure 9A:
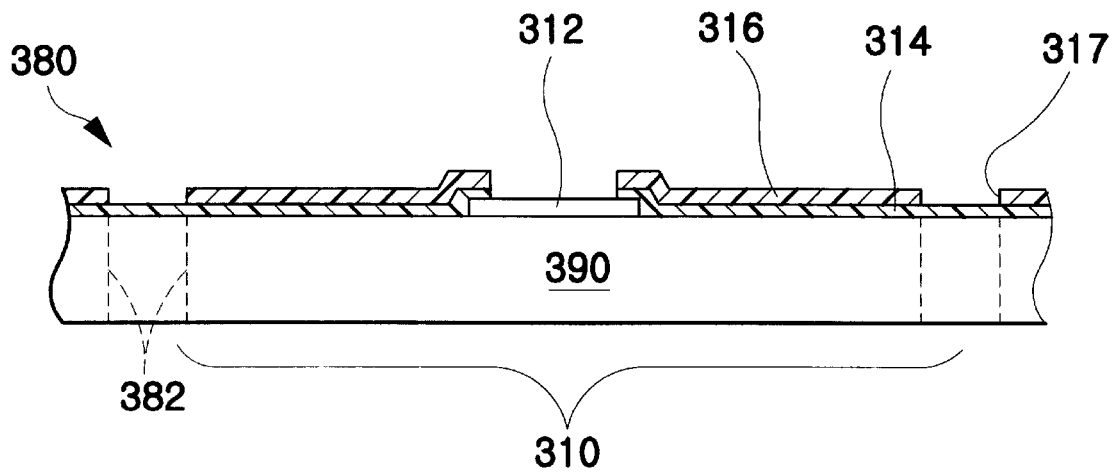
FIG. 9a is a cross-sectional view of a wafer having a polyimide layer that exposes scribe lines and pads.

The semiconductor chip 310 in the BGA package 400 will be explained with reference to FIGS. 9a through 9c. FIG. 9a shows a wafer 380 having a polyimide layer removed from above the pad 312 and a scribe area 382. FIG. 9a shows the wafer 380 after completion of backside grinding, and the thickness of the wafer 380 is between about 280 μm and about 450 μm depending on the desired thickness of the semiconductor chip 310. Alternatively, a wafer in which the backside grinding process is not completed may be used.

Figure 9B:
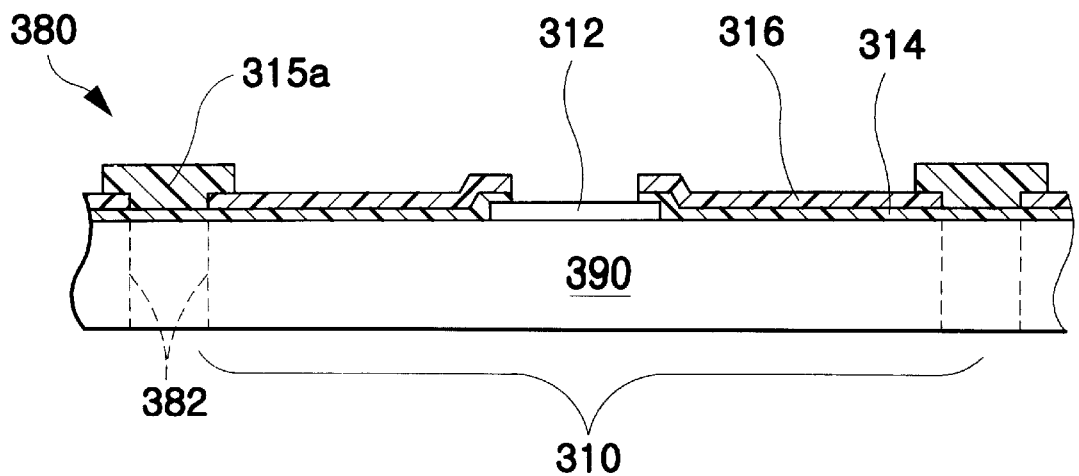
FIG. 9b is a cross-sectional view of the wafer of FIG. 9a after formation of a thick insulating region on the scribe area of the wafer.

FIG. 9b shows the wafer 280 after formation an insulating material 315a on the scribe area 382. A printing method can deposit the insulating material 315a, and the insulation material 315a is subsequently cured. Alternatively, a potting method can place the insulating material 315a on the scribe area 282 of the wafer 280.

Figure 9C:
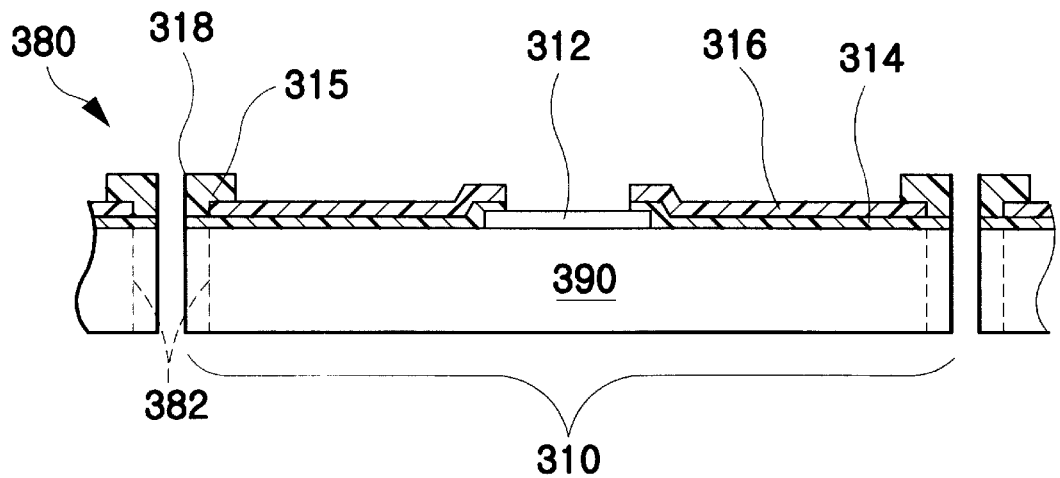
FIG. 9c is cross-sectional view of the wafer of FIG. 9b after cutting the wafer along scribe lines.

FIG. 9c shows the wafer 380 after cutting along the scribe lines in the scribe area 382 separates the individual semiconductor chips 310. Since the width required for cutting the wafer is smaller than that of the scribe area 382, a part of the insulation material 315a remains, thereby forming the insulation layer 315 on the edge of the semiconductor chip 310. Conventional wafer cutting techniques as described above can cut the insulating material 315a and the wafer 380 to separate the semiconductor chips 310. After obtaining a semiconductor chip 310, the conventional manufacturing processes described above can complete the package.

Figure 10:
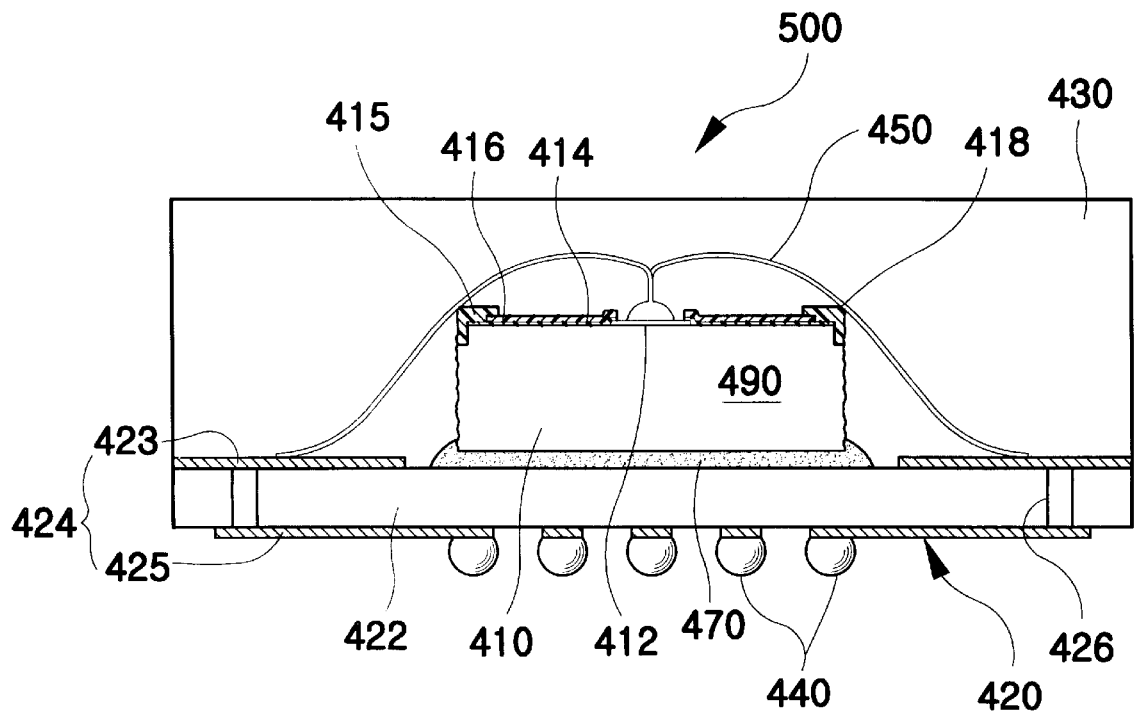
FIG. 10 is a cross-sectional view of a ball grid array package according to yet another embodiment of the present invention.

FIG. 10 is a cross-sectional view of a BGA package 500 according to still another embodiment of the present invention. The BGA package 500 includes an insulation layer 415 on the edge 418 of the semiconductor chip 410. The manufacturing method of the semiconductor chip 410 for BGA 500 is the same as that of the semiconductor chip illustrated in FIGS. 7a and 7e, except that a groove in the scribe area for the semiconductor chip 410 is shallower than that of the groove 284 in FIG. 7b. For example, the groove cut in the scribe area for the semiconductor chip 410 is preferably about 60 μm wide and between about 70 μm and about 150 μm deep.

Although, in FIG. 7a, a wafer before a backside grinding process is used, a wafer before or after the backside grinding process may be used for fabrication of the semiconductor chip 410. When using the wafer after the backside grinding process, a wafer cutting process is soon after forming the insulating material in the groove.

Although, in preferred embodiments of the present invention, a semiconductor chip is applied to a BGA package using a semiconductor chip of a center pad type, the semiconductor chip according to the present invention may also be applied to a lead frame having a die pad.

When stacking semiconductor chips and using bonding wire between the semiconductor chip and external terminals, a semiconductor chip of the edge-pad type is mainly used as the lower portion, whereas a semiconductor of an edge pad type or a center pad type is used for an upper portion. In accordance with the principals of the invention, processes for forming an insulation material or a polyimide layer on the edge of a semiconductor chip are also suitable for an edge pad type semiconductor chip. In particular, an insulating region on the lower semiconductor chip in a stack prevents the bonding wire of the upper semiconductor chip from contacting the edge of the lower semiconductor chip, and thereby the insulating material prevents electrical shorts.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A method for manufacturing a semiconductor package, comprising:

fabricating a semiconductor wafer having a plurality of semiconductor chips and a scribe area between the semiconductor chips, each semiconductor chip including integrated circuits formed on an active area of a silicon substrate, a plurality of pads electrically connected to the integrated circuits, a non-active layer formed on the active area except for the pads, and a polyimide layer formed on the non-active layer, the polyimide layer extending over the scribe area;

removing the polyimide layer from the scribe area;

cutting the wafer along the scribe area to separate the semiconductor chips;

attaching a selected one of the semiconductor chips to a substrate; and electrically connecting a bonding wire to one of the pads of the selected semiconductor chip and the substrate.

2. The method according to claim 1, wherein cutting the wafer comprises operating a diamond cutter having a grit size of 2 to 4 $\mu$m or 0.3 to 3 $\mu$m at a cutting rate of 20 mm of depth per second and a rotational speed of 35,000 to 40,000 rpm.

3. The method according to claim 1, further comprising encapsulating the semiconductor chip and the bonding wire.

4. A method for manufacturing a semiconductor package, comprising:

fabricating a semiconductor wafer having a plurality of semiconductor chips and a scribe area between the semiconductor chips, each semiconductor chip including integrated circuits formed on an active area of a silicon substrate, a plurality of pads electrically connected to the integrated circuits, a non-active layer formed on the active area except for the pads, a polyimide layer formed on the non-active layer;

removing the polyimide layer from the scribe area;

forming an insulation layer on the scribe area;

cutting the wafer along the scribe area to separate the semiconductor chips;

attaching a selected one of the semiconductor chips to a substrate; and electrically connecting a bonding wire to the substrate and one of the pads of the selected semiconductor chip.

5. The method according to claim 4, wherein, after said removing the polyimide layer from the scribe area, the method further comprises forming a groove in the scribe area, the groove having a width that is wider than a width of a cut along the scribe area.

6. The method according to claim 5, wherein cutting the wafer along the scribe area and forming the groove comprise using a diamond cutter having a grit size of 4 through 6 $\mu$m at a cutting rate of 80 mm of depth per second and a rotational speed of 35,000 through 40,000 rpm.

7. The method according to claim 5, wherein said forming the groove is before a backside grinding of the wafer.

8. The method according to claim 7, wherein after said forming the insulation layer, the method further comprises grinding the backside surface of the wafer to expose insulation filled into the groove.

9. The method according to claim 4, wherein forming the insulation layer comprises potting an insulation material along the scribe area before cutting the wafer along the scribe area to separate the semiconductor chips.

10. The method according to claim 4, wherein the insulation layer is a plastic resin of an epoxy type.

11. A method for manufacturing a semiconductor package, comprising:

fabricating a semiconductor wafer having a plurality of semiconductor chips and a scribe area between the semiconductor chips, each semiconductor chip including integrated circuits in and on an active area of a semiconductor substrate and a plurality of pads electrically connected to the integrated circuits;

forming a groove in the scribe area;

filling the groove with an insulating material;

removing a back portion of the semiconductor substrate, including a portion of the semiconductor substrate under the groove;

cutting the wafer along the scribe area to separate the semiconductor chips;

attaching a selected one of the semiconductor chips to a substrate; and electrically connecting a bonding wire to the substrate and one of the pads of the selected semiconductor chip.

12. The method according to claim 11, wherein, after cutting the wafer along the scribe area to separate the semiconductor chips, the insulating material remains on at least a portion of a top surface and a side of one of the semiconductor chips.

13. The method according to claim 4, wherein forming the insulation layer comprises printing an insulation material on the scribe area before cutting the wafer along the scribe area to separate the semiconductor chips.

14. The method according to claim 13, wherein the insulation material is an epoxy resin.

15. The method according to claim 4, wherein forming the insulation layer comprises potting an insulation material along the scribe area after cutting the wafer along the scribe area to separate the semiconductor chips.

16. The method according to claim 15, wherein the insulation material is an epoxy resin.

17. The method according to claim 11, wherein a groove has a width greater than a width of the cut along the scribe area to separate the semiconductor chips.

18. The method according to claim 11, wherein forming the groove comprises using a diamond cutter having a grit size of 4 to 6 $\mu$m at a cutting rate of 80 mm of depth per second and a rotational speed of 35,000 to 40,000 rpm.

19. The method according to claim 11, wherein removing the back portion of the semiconductor substrate comprises grinding the back portion by an amount sufficient to expose the insulating material in the groove.

* * * * *